United States Patent [19]
Green

[11] 4,142,114
[45] Feb. 27, 1979

[54] INTEGRATED CIRCUIT WITH THRESHOLD REGULATION

[75] Inventor: Robert S. Green, Richardson, Tex.

[73] Assignee: Mostek Corporation, Carrollton, Tex.

[21] Appl. No.: 816,364

[22] Filed: Jul. 18, 1977

[51] Int. Cl.$^2$ .................. H03K 1/02; H03K 3/353
[52] U.S. Cl. .................. 307/304; 307/200 B; 307/297
[58] Field of Search ............ 307/200 B, 251, 297, 307/304, 359, 362, 363, DIG. 4

[56] References Cited

U.S. PATENT DOCUMENTS

| T954,006 | 1/1977 | Lee et al. | 307/304 |
|---|---|---|---|
| 3,406,298 | 10/1968 | Axelrod | 307/304 X |
| 3,609,414 | 9/1971 | Pleshko et al. | 307/304 X |
| 3,700,981 | 10/1972 | Masuhara | 307/304 X |
| 3,757,145 | 9/1973 | Adam et al. | 307/304 |
| 3,794,862 | 2/1974 | Jenne | 307/304 |
| 3,806,741 | 4/1974 | Smith | 307/304 |
| 4,099,980 | 9/1977 | Maitland | 307/304 |

OTHER PUBLICATIONS

Blaser et al., "Substrate and Load Gate Voltage Compensation"; *IEEE—Int'l Solid-State Circuits Conf.*; 2/18/76; pp. 56-57.

Blaser et al.; *IBM Tech. Discl. Bull.;* vol. 19, No. 7, pp. 2530-2531; 12/1976.

Hummel, "Sentry Circuit for Substrate Voltage Control"; *IBM Tech. Discl. Bull.;* vol. 15, No. 2, pp. 478-479; 7/1972.

Frantz, "Threshold Voltage Control for N-Channel Mosfet Devices"; *IBM Tech. Discl. Bull.;* vol. 12, No. 12, p. 2078; 5/1970.

*Primary Examiner*—Larry N. Anagnos
*Attorney, Agent, or Firm*—James J. Mullen

[57] ABSTRACT

Threshold voltage regulation of field-effect transistors on a common substrate of an integrated circuit is achieved by adjusting the back bias on the substrate using a charge pump that is selectively operated whenever the threshold voltage of a designated enhancement mode FET falls below a reference voltage. A voltage divider provides the reference voltage that is applied to the gate of the enhancement mode FET, which when turned-on enables the charge pump.

5 Claims, 4 Drawing Figures

INTEGRATED CIRCUIT WITH THRESHOLD REGULATION

BACKGROUND OF THE INVENTION

The present invention pertains to integrated circuits, and particularly to MOS circuits using field-effect transistors.

The relatively wide degree of variation in the threshold voltages of FETs has imposed performance limitations on prior art MOS integrated circuits. Threshold voltage is affected by intrinsic factors such as gate oxide thickness and channel impurity concentration, which are caused by inevitable process variations. Threshold voltage is also affected by extrinsic factors such as the ambient temperature in which the device operates. Accordingly, MOS integrated circuits must be designed for the combined worst-case effects of both such intrinsic and extrinsic factors. Furthermore, response time and other device parameters must be specified to reflect the worst-case threshold voltage. These and other problems of the prior art are greatly alleviated by the present invention.

SUMMARY OF THE INVENTION

In accordance with the present invention, the threshold voltages of field-effect transistors in an integrated circuit are maintained at predetermined levels by automatically adjusting the substrate bias to compensate for both intrinsic and extrinsic factors that influence threshold voltage.

In a preferred embodiment of the invention, the substrate bias is adjusted by a charge pump which is selectively driven whenever the threshold voltage of a designated field-effect transistor deviates by a predetermined amount from a reference voltage, the reference voltage being a percentage of the difference between two supply voltages, the gate of the designated field-effect transistor being coupled to the reference voltage.

The novel features believed characteristic of the invention are set forth in the appended claims. The nature of the invention, however, as well as its essential features and advantages, may be understood more fully upon consideration of an illustrative embodiment when read in conjunction with the accompanying drawings wherein:

DESCRIPTION OF THE PREFERRED EMBODIMENTS

Figure 1:
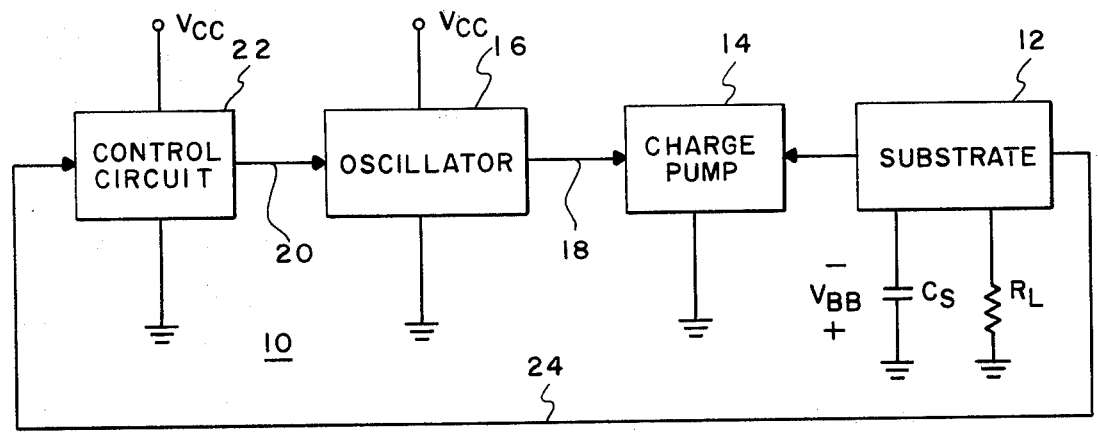
FIG. 1 is a circuit block diagram illustrating the operation of the present invention.

FIG. 1 depicts a portion of an integrated circuit of the present invention in block diagram form, generally indicated by reference numeral 10. The circuit 10 is formed on a single semiconductor chip comprising a substrate 12 upon which various elements, such as field-effect transistors, are formed using known techniques. In practice, the elements are interconnected to form various circuits, which utilize the circuit 10 of FIG. 1 for controlling substrate bias.

In the present example, the circuit 10 is powered by two voltage supplies: a high potential source, designated $V_{CC}$; and a low potential source, shown as ground. The terms "high" and "low" as used herein are not intended to designate a particular polarity or voltage level; rather, "high" may be either positive or negative with respect to "low" depending on the substrate conductivity type. It is presently preferred that the substrate 12 be P-type conductivity, in which case $V_{CC}$ will be positive (typically +5 volts) with respect to ground. The terms "high potential" and "low potential" will be used herein interchangeably with $V_{CC}$ and ground respectively, but it is to be understood that no particular limitation should be construed therefrom.

The substrate 12 is not tied to either of the two potentials, but in absence of a regenerative charge will move toward ground potential due to leakage inherent in the chip structure depicted as $R_L$. An inherent capacitance $C_S$ also exists between the substrate 12 and ground, permitting the substrate to be charged to a potential other than ground by a charging current (described below) that exceeds the leakage current through $R_L$.

It is desirable to reverse bias the junctions of the FETs, which among other things increases the speed of the integrated circuit. Accordingly, the P-type substrate 12 is made negative with respect to ground. This is accomplished in accordance with the present invention by means of a charge pump 14 and an oscillator 16, which together generate the desired back bias $V_{BB}$ on the substrate 12. The ability to develop a negative $V_{BB}$ on the chip eliminates the necessity of an external substrate biasing supply. More importantly, however, this self-biasing feature permits internal control of $V_{BB}$ for regulating the threshold voltages of FETs as will be described more fully below.

The oscillator 16 has an output 18, which selectively drives the charge pump 14 whenever the oscillator 16 is operational. The oscillator 16 is selectively enabled by an input 20, which is driven by a control circuit 22. The control circuit is responsive to the substrate potential $V_{BB}$ as depicted by feedback line 24. The charge pump 14 and oscillator 16 are designed to be capable of generating a charging current in excess of the leakage current through $R_L$, such that $V_{BB}$ may be adjusted to a predetermined level by controlling the duty cycle of the oscillator 16. When the oscillator 16 is operational, the charge pump 14 incrementally pulls a negative charge onto the substrate 12 during each cycle of the oscillator 16. When the oscillator 16 is not operational, the substrate 12 slowly discharges toward ground through $R_L$. $V_{BB}$ can thereby be maintained within predetermined limits by the control circuit 22, which adjusts the duty cycle of the oscillator 16 to pulse the charge pump 14 at appropriate intervals.

Figure 2:
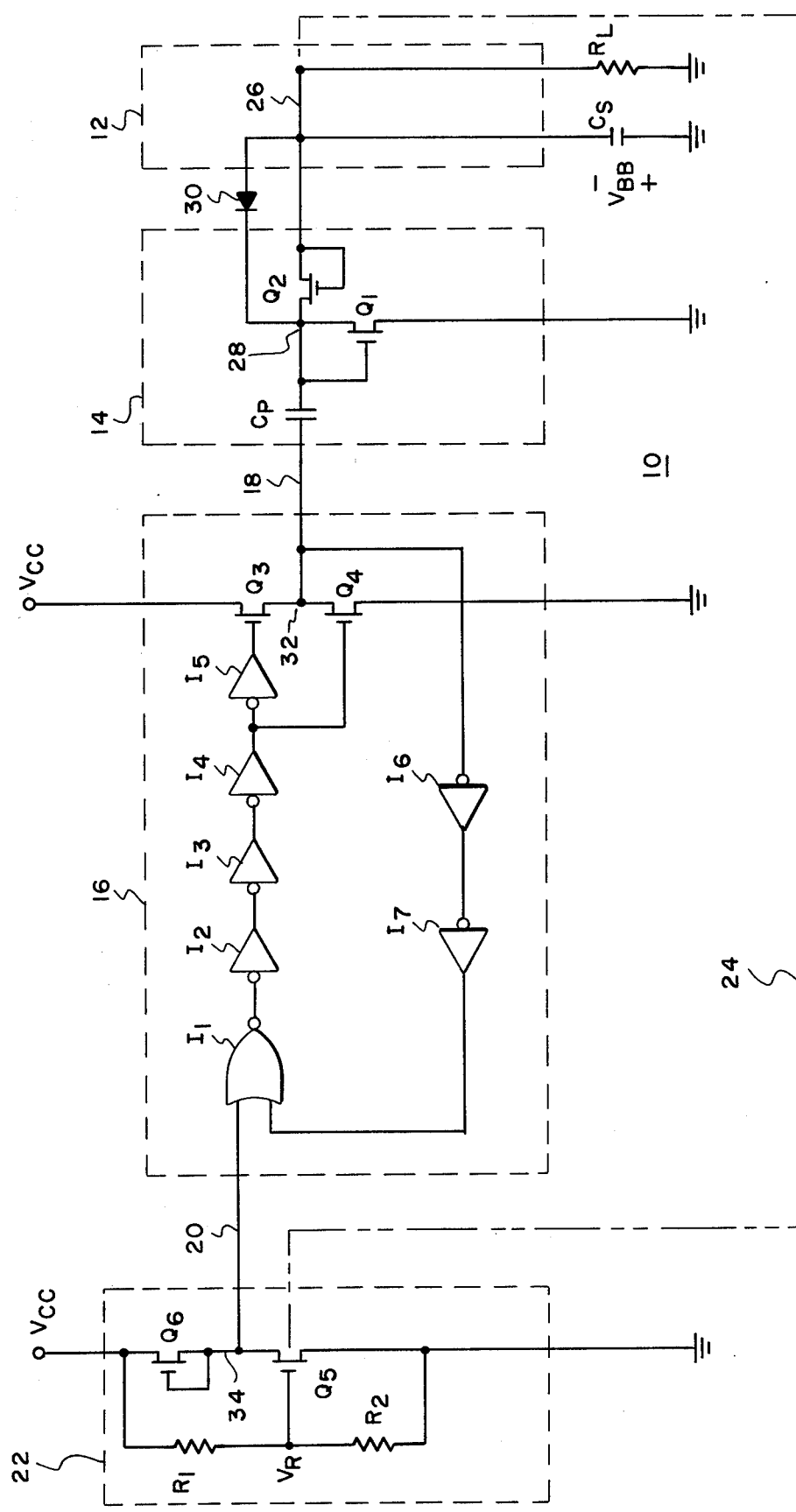
FIG. 2 is a presently preferred circuit implementation of the present invention.

FIG. 2 illustrates the details of a presently preferred circuit implementation for adjusting the substrate bias to regulate the threshold voltage of FETs on a single semiconductor substrate, like numerals designating previously mentioned similar parts. Connection to the substrate 12 is facilitated at node 26, which in practice may be implemented by a metal pad (not shown) formed on the upper surface of the integrated circuit chip. The metal pad is connected to a metal base upon which the chip is mounted with the substrate 12 contacting the metal base.

The charge pump 14 comprises a capacitor $C_P$, which may be formed by known MOS techniques such as by depositing highly conductive polycrystalline silicon on a thin insulating layer overlying an $N^+$ region formed in the P-type substrate 12. One side of the capacitor $C_P$ is connected to the oscillator output 18. The other side of the capacitor $C_P$ is connected to a charge pump node 28, which is formed at a common $N^+$ region of two enhancement mode FETs, $Q_1$ and $Q_2$. Transistor $Q_1$ has its gate connected to node 28 and its source connected to the ground potential. Transistor $Q_2$ has its gate and drain connected to the substrate node 26 as shown. The PN junction between the substrate 12 and the common $N^+$ region of the FETs $Q_1$ and $Q_2$ is represented by the diode 30, which plays a part in the operation of the circuit 10 as will be described below.

The oscillator 16 preferably comprises a seven-stage ring counter consisting of a two-input NOR stage $I_1$ and inverters $I_2$ through $I_7$ connected as shown. Two enhancement mode FETs Q3 AND Q4 are serially connected between the high and low potentials in the manner depicted with a common region 32 forming the oscillating node for driving the charge pump 14. The gate of transistor $Q_3$ is driven by inverter $I_5$. The gate of transistor $Q_4$ is driven by inverter $I_4$. Node 32 drives inverter $I_6$. The oscillator input 20 provides a first of two inputs to the NOR stage $I_1$, the second being provided by inverter $I_7$. The use of seven inverter stages is preferred over other possible arrangements because the resulting wave shape and frequency of the oscillator 16 produces an appropriate charging current. Thus, it is expected that various other integrated circuits with somewhat different requirements might advantageously use a different oscillator arrangement.

In the presently most preferred embodiment, the control circuit 22 is equipped to regulate the threshold voltages of FETs on the chip by adjusting the substrate bias $V_{BB}$. The threshold voltage $V_T$ of a designated enhancement mode FET $Q_5$ is detected by applying a reference voltage $V_R$ to its gate. A depletion mode FET $Q_6$ is interposed between the drain of transistor $Q_5$ and $V_{CC}$ to form a node 34 for driving the oscillator input 20. The gate of transistor $Q_6$ is interconnected to its source at node 34 so that $Q_6$ functions much like a load resistor, enabling a logic level to be established on node 34 in response to the conductance of $Q_5$. The conductance of $Q_5$ is a function of the difference between its gate-to-source voltage (i.e., $V_R$) and its threshold voltage $V_T$. The threshold voltage of FETs on the substrate 12 is a function of $V_{BB}$, which relationship is employed by the control circuit 22 is depicted by line 24 shown in phantom from the substrate 12 to transistor $Q_5$. The reference voltage $V_R$ is provided by a voltage divider consisting of seriesed resistors $R_1$ and $R_2$ connected between $V_{CC}$ and ground. The resistors $R_1$ and $R_2$ may be formed in accordance with known techniques, preferably using polycrystalline silicon strips of varying lengths. The resistance values of $R_1$ and $R_2$ are selected to provide a $V_R$ that is approximately equal to the desired value of $V_T$ at a given current. Assuming it is desirable, for example, that $V_T$ be regulated to equal the threshold voltage of a typical enhancement mode FET at room temperature in an unregulated prior-art device, then $R_1$ and $R_2$ are selected to provide $V_R$ roughly equal to such voltage.

Figure 3:
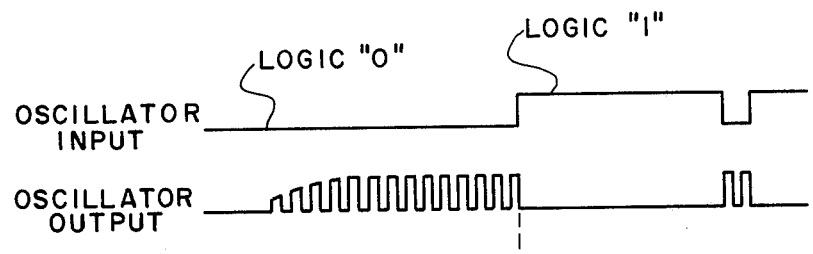
FIG. 3 illustrates various parameters of the inventive circuit plotted relative to each other in time; and, FIG. 4 is a graph illustrating the improved performance of the present invention relative to prior art devices.
Figure 3:
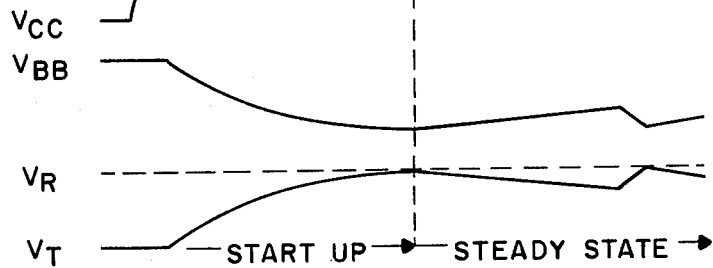

An understanding of the operation of the circuit 10 of FIG. 2 will be aided by reference to the diagram of FIG. 3. The following explanation of the operation of the circuit 10 includes presently preferred parameter values, which are given by way of example to promote an understanding of the invention rather than as limitations thereon. During the start-up phase as depicted in FIG. 3, $V_{CC}$ begins to rise from ground to +5 volts. Node 34 will momentarily move up with $V_{CC}$ since $Q_6$ is a depletion mode FET. However, as far as the oscillator 16 is concerned, the input 20 remains low or at a logic "0", since $Q_5$ quickly turns on and pulls node 34 low. As soon as $V_{CC}$ is high enough to cause $Q_3$ to be turned on by inverter stage $I_5$, the oscillator 16 will become operational. When the oscillator output node 18 goes high, the capacitor $C_P$ tries to pull up node 28. However, node 28 will only move up by a threshold, at which point $Q_1$ will turn on, thereby holding node 28 a threshold above ground. The high oscillator output is fed back through inverter stages $I_6$ and $I_7$ to cycle the oscillator 16 thereby turning $Q_4$ on and $Q_3$ off, which quickly pulls the output 18 back low. As the output 18 goes low, the capacitor $C_P$ pulls node 28 down to a negative voltage below the substrate potential, thereby turning on $Q_2$ and forward biasing the diode 30. Current then flows from node 26 to node 28 to negatively charge the substrate 12. During each cycle of the oscillator 16, the substrate 12 is incrementally charged in this manner, thereby generating a negative $V_{BB}$ as depicted in FIG. 3.

Initially the FETs on the chip have a $V_T$ of about 0.5 volts below the steady-state value of $V_T$, which is roughly equal to $V_R$. Assuming, for example, a $V_R$ of about 0.77 volts, $V_T$ with no substrate bias will be about 0.27 volts. As $V_{BB}$ goes negative, $V_T$ begins to rise toward $V_R$. The transistor $Q_5$ is made very large so that it will remain highly conductive relative to transistor $Q_6$ until $V_T$ approaches to within about 20 millivolts of $V_R$. The high relative conductance of $Q_5$ causes node 34 to be held low, thus keeping the oscillator 16 operational and continuing to pump the substrate 12 until $V_T$ is very close to $V_R$. When $V_T$ reaches a point where the conductance of $Q_5$ is roughly equal to the conductance of $Q_6$, node 34 goes high, i.e., presents a logic "1" to the oscillator input 20. This typically will occur when node 34 reaches about 2.5 volts. A logic "1" at input 20 to the NOR stage $I_1$ disables the oscillator 16, as the circuit 10 enters the steady-state phase.

As long as the oscillator 16 is not operational, no additional charging current is pulled from the substrate 12, thereby allowing $V_{BB}$ to drift back toward ground as charge leaks off through $R_L$. This in turn causes $V_T$ to begin dropping, thus increasing the conductance of $Q_5$ and gradually pulling node 34 back low. At some point (e.g., at about 1.0 volt) node 34 becomes low enough to present a logic "0" to input 20 of the NOR stage $I_1$, which again enables the oscillator 16 to drive the charge pump 14 and increase the negative bias on the substrate 12. The above sequence of events then continues during steady-state operation to automatically adjust $V_{BB}$ to regulate $V_T$ to within about 20 millivolts of $V_R$.

The duty cycle of the oscillator 16 determines the charging current necessary to compensate for the leakage current through $R_L$. The leakage current, however, increases with rising temperature. In addition, $V_T$ for a constant $V_{BB}$ decreases with rising temperature. Thus, in order to regulate $V_T$ to a constant value of $V_R$, the charging current must increase with rising temperature not only to compensate for increasing leakage current, but to drive $V_{BB}$ sufficiently more negative to compensate for the tendency of $V_T$ to decrease as the temperature rises.

Figure 4:
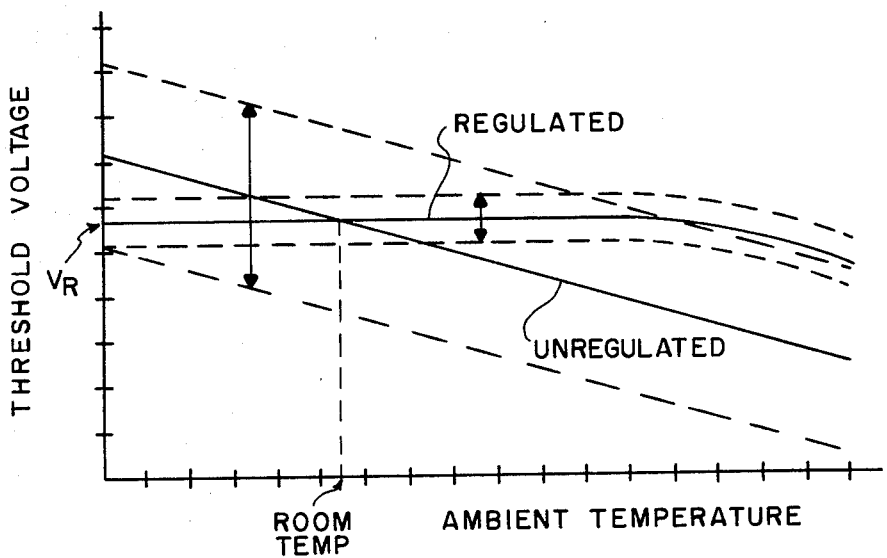

FIG. 4 graphically illustrates the above self-regulating feature of the present invention which automatically regulates $V_T$ to very near $V_R$ throughout a normal operating range of temperature. For example, the oscillator 16 and charge pump 14 are designed to regulate $V_T$ beyond a specified maximum operating temperature of 70° C. Around 90° C. the oscillator 16 is continuously operational such that a maximum charging current is supplied to the substrate 12. Therefore, $V_T$ begins to drop for temperature beyond about 90° C. as indicated by the "regulated" curve at the high temperature end of the scale. Contrasting the regulated $V_T$ of the present invention is a curve designated as "unregulated" which depicts the effect of temperature on $V_T$ for a prior-art device wherein $V_T$ decreases with rising temperature at about 2.7 mv/°c.

The dashed lines shown on either side of the two solid line curves provide an indication of the effect of process variations on the variation of $V_T$ from the norm. The $V_T$ of the prior-art device is highly dependent upon such process-sensitive factors as gate oxide thickness and channel impurity concentration, which accounts for a deviation of about +0.20 volts for a 99% $V_T$ distribution. On the other hand, such factors effecting $V_T$ are for the most part automatically compensated for by the regulation of $V_T$ to $V_R$. Thus, the deviation from the norm of $V_T$ in the regulated device of the present invention is principally due to variations in the resistors $R_1$ and $R_2$ which establish $V_R$. The formation of $R_1$ and $R_2$ can be controlled so that only a +0.05 volt deviation exists for a 99% distribution of $V_T$ for regulated devices. The present invention thus provides a narrower distribution of $V_T$ as indicated by the arrows, which, along with the temperature compensating feature, provides greater predictability for purposes of design and operating specifications, as will be appreciated by those skilled in the art.

Referring again to FIG. 2, additional details of the circuit will now be discussed. The effectiveness of the control circuit 22 depends on the relative conductance of transistors $Q_5$ and $Q_6$, the larger $Q_5$ is relative to $Q_6$, the more effective will be the regulation of $V_T$. In the presently most preferred embodiment of the invention, the width-to-length ratio is about 70 for $Q_5$ and about 0.25 for $Q_6$. This size difference enables $Q_5$ to hold node 34 sufficiently low such that the oscillator 16 is kept operational until $V_T$ approaches within about 20 millivolts of $V_R$.

In the charge pump circuit 14, the transistor $Q_2$ provides a current path from node 26 to node 28 which parallels the path from the P-type substrate 12 into the N-type region at node 28 represented by diode 30. This seeming redundancy serves a very useful purpose. Since transistor $Q_2$ is coupled to the substrate 12 at node 26, its threshold voltage remains at the no-bias value of $V_T$ rather than increase with greater magnitudes of $V_{BB}$ as do the thresholds of the other FETs on the chip. Therefore, $Q_2$ will conduct whenever the voltage on node 28 drops below the voltage on node 26 by more than the no-bias $V_T$ of about 0.27 volts. On the other hand, the diode 30 has a forward voltage drop of about 0.7 volts. The presence of $Q_2$ in the pump circuit 14 thus enables $V_{BB}$ to be pumped more negative than would otherwise be the case if only the diode 30 were relied on as a means for coupling the substrate 12 to the charge pump node 28. This fact will be more readily appreciated by way of the following specific example.

When the oscillator 16 is operational, the charge pump node 28 is pulled to about +4.0 volts every cycle. This occurs because node 18 drops from near $V_{CC}$ (i.e., +5 volts) to near ground causing node 28 to drop by a similar amount from its maximum value of about a threshold above ground. Thus in theory $V_{BB}$ can be pulled negative in increments every cycle of the oscillator 16 until $V_{BB}$ approaches −4.0 volts less the threshold of $Q_2$, or roughly −3.7 volts. However, the charge pump 14 is not permitted to run until such theoretically maximum magnitude of $V_{BB}$ is reached. At room temperature, for example, $V_{BB}$ is pulled down to about −2.35 volts. In order to compensate for increasing temperature to regulate $V_T$ to $V_R$, $V_{BB}$ is adjusted automatically by about 8 mv/°c. to a peak magnitude of about −2.95 volts at 90° C. At higher temperatures, $V_{BB}$ peaks out and begins to move back toward ground as the leakage current through $R_L$ exceeds the capacity of the oscillator 16 and charge pump 14 to generate charging current. $V_{BB}$ never reaches the theoretically possible maximum of −3.7 volts, since by the time the oscillator's duty cycle is full on, the leakage current is too large to overcome.

Although a preferred embodiment of the invention has been described in detail, it is to be understood that various changes, substitutions and alterations can be made therein without departing from the spirit and scope of the invention as defined by the appended claims.

What is claimed is:

1. An integrated circuit formed on a single semiconductor substrate with circuitry for adjusting substrate bias to regulate the threshold voltage of field-effect transistors, comprising:
   means for receiving a low potential to the circuit,
   means for receiving a high potential to the circuit,
   an oscillator having an output that rapidly varies between a voltage near the high potential and a voltage near the low potential,
   charge pump means connected between the oscillator output and the substrate for incrementally charging the substrate during each cycle of the oscillator wherein a field-effect transistor is connected between the substrate and the charge pump means to provide a path parallel to an inherent injection path created by the junction of the substrate and the charge pump means,
   controlling means comprising detector means responsive to the substrate potential for enabling the oscillator to selectively pump the substrate whenever the threshold voltage of a designated field-effect transistor deviates by a predetermined amount from a reference voltage wherein the detector means comprises a voltage divider circuit for providing the reference voltage to the gate of the designated field-effect transistor, the designated field-effect transistor operating in the enhancement mode, and the reference voltage being a percentage of the high potential relative to the low potential.

2. The integrated circuit of claim 1 wherein the field-effect transistor connected between the substrate and the charge pump means has a threshold voltage lower than the voltage drop of the inherent injection path whereby the back bias on the substrate is pumped more negative than possible if the inherent injection path was the only coupling between the charge pump means and the substrate.

3. The integrated circuit of claim 2 wherein the field-effect transistor connected between the substrate and the charge pump means has its source connected to the charge pump means and its drain and gate connected to the substrate.

4. An integrated circuit formed on a single semiconductor substrate with circuitry for charging the substrate, comprising:
   a substrate,
   a high potential source,
   a low potential soure,
   an oscillator having an input responsive to the voltage level on the drain of a designated field-effect transistor, and having an output that rapidly varies between a voltage near the hgh potential and a voltage near the low potential,
   controlling means comprising detector means responsive to the substrate potential for enabling the oscillator to selectively pump the substrate whenever the threshold voltage of the designated field-effect transistor deviates by a predetermined amount from a reference voltage wherein the detector means comprises a voltage divider circuit for providing the reference voltage to the gate of the designated field-effect transistor operating in the enhancement mode and having its source coupled to the low potential source and having its drain coupled to the oscillator input and to the source and gate of a depletion mode field-effect transistor having its drain coupled to a high potential source for permitting the drain of the designated field-effect transistor to be pulled low whenever the reference voltage exceeds the threshold voltage of the designated field-effect transistor by a predetermined amount, and the reference voltage being a percentage of the high potential relative to the low potential,
   charge pump means coupled between the oscillator output and the substrate for incrementally charging the substrate during each cycle of the oscillator,
   a capacitor coupling the oscillator to the charge pump means,
   means for holding the charge pump means at a potential near the low potential when the oscillator output is high, and
   a field effect transistor for selectively coupling the substrate to the charge pump means when the oscillator output is low, connected between the substrate and the charge pump means to provide a path parallel to an inherent injection path created by the junction of the substrate and the charge pump means and having a threshold voltage lower than the voltage drop of the inherent injection path whereby the back bias on the substrate is pumped more negative than possible if the inherent injection path was the only coupling between the charge pump means and the substrate.

5. The integrated circuit of claim 4 wherein the means for holding the charge pump means is a field-effect transistor with its drain and gate connected to the charge pump means and its source connected to the low potential whereby said means is not conductive when the charge pump means is held at a potential near the low potential.

* * * * *

UNITED STATES PATENT AND TRADEMARK OFFICE
CERTIFICATE OF CORRECTION

PATENT NO. : 4,142,114
DATED : Feb. 27, 1979
INVENTOR(S) : Robert S. Green

It is certified that error appears in the above—identified patent and that said Letters Patent are hereby corrected as shown below:

| | | |
|---|---|---|
| Col. 5, line 25 | +0.20 | should be $\pm 0.20$ |
| Col. 5, line 32 | +0.05 | should be $\pm 0.05$ |
| Col. 6, line 4 | +4.0 | should be -4.0 |

Signed and Sealed this

Third Day of February 1981

[SEAL]

Attest:

RENE D. TEGTMEYER

Attesting Officer     Acting Commissioner of Patents and Trademarks